(12) United States Patent
Meyer et al.

(10) Patent No.: US 9,030,019 B2
(45) Date of Patent: May 12, 2015

(54) SEMICONDUCTOR DEVICE AND METHOD OF MANUFACTURE THEREOF

(75) Inventors: Thorsten Meyer, Regensburg (DE); Ludwig Heitzer, Falkenfels (DE)

(73) Assignee: Infineon Technologies AG, Neubiberg (DE)

( * ) Notice: Subject to any disclaimer, the term of this patent is extended or adjusted under 35 U.S.C. 154(b) by 650 days.

(21) Appl. No.: 12/967,962

(22) Filed: Dec. 14, 2010

(65) Prior Publication Data

US 2012/0146231 A1 Jun. 14, 2012

(51) Int. Cl.
*H01L 23/48* (2006.01)
*H01L 23/31* (2006.01)
*H01L 23/00* (2006.01)

(52) U.S. Cl.
CPC ............ *H01L 23/3128* (2013.01); *H01L 24/02* (2013.01); *H01L 24/19* (2013.01); *H01L 24/20* (2013.01); *H01L 2224/04105* (2013.01); *H01L 2224/02379* (2013.01); *H01L 24/13* (2013.01); *H01L 2224/0239* (2013.01); *H01L 2224/12105* (2013.01); *H01L 2224/13024* (2013.01); *H01L 2224/13111* (2013.01); *H01L 2924/01322* (2013.01); *H01L 2224/02311* (2013.01); *H01L 2924/01029* (2013.01)

(58) Field of Classification Search
CPC ....... H01L 23/48; H01L 21/44; H01L 23/498; H01L 23/00; H01L 23/31
USPC ......... 257/773, 774, 775, 776, 781, 786, 784, 257/734, 736, 758, 759, 760, 737
See application file for complete search history.

(56) References Cited

U.S. PATENT DOCUMENTS

| | | | | |
|---|---|---|---|---|
| 6,600,234 B2 * | 7/2003 | Kuwabara et al. | ............. | 257/790 |
| 6,770,971 B2 * | 8/2004 | Kouno et al. | ................. | 257/734 |
| 6,952,048 B2 * | 10/2005 | Terui | ............... | 257/678 |
| 6,982,494 B2 * | 1/2006 | Anzai | ........... | 257/786 |
| 7,230,326 B2 | 6/2007 | Ohkura | | |
| 8,003,515 B2 * | 8/2011 | Meyer et al. | ................. | 438/622 |
| 2006/0177964 A1 | 8/2006 | Hedler et al. | | |
| 2008/0169539 A1 * | 7/2008 | Fang et al. | ..................... | 257/676 |
| 2009/0294961 A1 * | 12/2009 | Meyer et al. | ................. | 257/738 |
| 2010/0073663 A1 | 3/2010 | Meyer | | |
| 2011/0121449 A1 * | 5/2011 | Lin et al. | ....................... | 257/737 |
| 2012/0038043 A1 * | 2/2012 | Jin | ................ | 257/737 |

OTHER PUBLICATIONS

Hallereau, S., "Reverse Costing Analysis: eWLB (X-GOLDTM 213) by Infineon, Reverse Analysis Report of a Fan-out Wafer Level Package," Version 1, Jan. 2010, pp. 1-10.

* cited by examiner

*Primary Examiner* — Chuong A Luu
(74) *Attorney, Agent, or Firm* — Slater & Matsil, L.L.P.

(57) ABSTRACT

A semiconductor device and a method of making a semiconductor device are disclosed. The semiconductor device comprises a redistribution layer arranged over a chip, the redistribution layer comprising a first redistribution line. The semiconductor further comprises an isolation layer disposed over the redistribution layer, the isolation layer having a first opening forming a first pad area and a first interconnect located in the first opening and in contact with the first redistribution line. The redistribution line in the first pad area is arranged orthogonal to a first direction to a neutral point of the semiconductor device.

21 Claims, 4 Drawing Sheets

SEMICONDUCTOR DEVICE AND METHOD OF MANUFACTURE THEREOF

TECHNICAL FIELD

The present invention relates generally to a semiconductor device and a method for manufacturing a semiconductor device.

BACKGROUND

Generally, after a wafer is completely processed, the chips are diced and then packed into individual packages or mounted with other components in hybrid or multichip modules.

The package may provide a connection of the chip to a printed circuit board (PCB) or to an electronic product. The connection may not be made directly to the chip due to the thin and fragile metal system used in the chip.

The package may physically protect the chip from breakage or contamination. The package may also protect the chip from chemicals, moisture and/or gases that may interfere with the chip.

The package may also dissipate heat from the chip when the chip is under operation. Some chips may generate large quantities of heat so that it is important that the enclosure material may serve to draw the heat away from the chip.

SUMMARY OF THE INVENTION

In accordance with an embodiment of the present invention, a semiconductor device is disclosed. The semiconductor device comprises a redistribution layer arranged over a chip, the redistribution layer comprising a first redistribution line. The semiconductor further comprises an isolation layer disposed over the redistribution layer, the isolation layer having a first opening forming a first pad area and a first interconnect located in the first opening and in contact with the first redistribution line. The redistribution line in the first pad area is arranged orthogonal to a first direction to a neutral point of the semiconductor device.

In accordance with another embodiment of the present invention, a method for manufacturing a semiconductor device is disclosed. The method comprises forming a first redistribution line over a chip, the first redistribution line electrically connected to a first chip pad located on a top surface of the chip, and forming a solder stop layer over the redistribution line. The method further comprises forming a first pad area by forming a first opening in the solder stop layer exposing the first redistribution line such that the first redistribution line in the first pad area is oriented orthogonal to a first direction to a neutral point of the semiconductor device, and attaching a first interconnect to the first pad area.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a wafer level package or an embedded wafer level ball grid array. The invention may also be applied, however, to other types of semiconductor devices.

Wafer level packaging refers to a packaging technology where an integrated circuit is packaged at wafer level. The chips are packaged directly on the wafer and dicing of the wafer takes place after the chips are packaged. Wafer level packaging may be used to manufacture chip scale packages.

Fan-out wafer level packaging may be an enhancement of the wafer level packaging. The packages may not be realized on a silicon wafer but on an artificial wafer. A standard wafer is diced and the singulated chips are placed on a carrier. The distances between the chips on the carrier may be chosen freely. The gaps around the chips may be filled with a casting compound to form an artificial wafer. The artificial wafer is processed to manufacture packages comprising the chips and a surrounding fan-out area. Interconnect elements may be realized on the chip and the fan-out area forming an embedded wafer level ball grid array (eWLB) package.

Fan-out wafer level packaging may provide a packaging solution for chips requiring a higher integration level and a greater number of contacts for a given pitch compared to chip manufactures applying a standard wafer level packaging technology.

Embodiments of the present invention may provide high device reliability due to the orientation of the redistribution lines in pad areas. Embodiments may provide high device reliability due to a line-pad design. Embodiments may provide a high interconnect yield due to a thicker solder stop layer. Embodiments may increase the routing density of the redistribution lines of the redistribution layer. Embodiments may allow the application of more redistribution lines between the interconnects, which makes the package design potentially easier.

Figure 1:
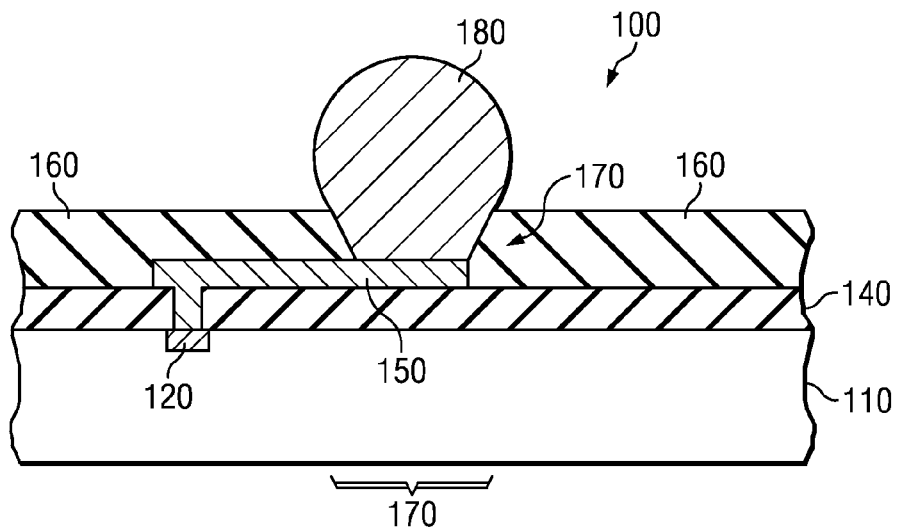
FIG. 1 shows a cross sectional view of a semiconductor device comprising a pad area.

FIG. 1 illustrates a cross-sectional view of one embodiment of semiconductor device 100. The semiconductor device 100 may be manufactured according to a standard wafer level packaging process, according to a fan-out wafer level packaging process, or according to any other suitable packing process.

The semiconductor device 100 includes a semiconductor chip 110 having a chip pad 120. The semiconductor device 100 includes a first isolation layer 140, a redistribution line 150 of a redistribution layer (RDL), and a second isolation layer 160. An interconnect 180 is placed over a pad area 170 and soldered to the redistribution line 150. The semiconductor chip 110 may be a baseband, a RF or a power management chip.

The semiconductor chip 110 may comprise an integrated circuit having a top metallization layer (not shown). The top metallization layer may be embedded in an inter-layer dielectric. The chip pad 120 may be arranged in or over and in contact with the top metallization layer. The chip pad 120 may comprise aluminum (Al) or other suitable materials. A passivation layer may cover the inter-layer dielectric and the metallization layer but may not cover the chip pad 120. The passivation layer may seal and protect the semiconductor chip 110.

The first isolation layer 140 may be arranged on the semiconductor chip 110. The first isolation layer 140 may be a dielectric material or an epoxy based material, for example. The dielectric material may comprise a polymer such as a polyimide. The first isolation layer 140 may be formed using a spin-on deposition or any other suitable deposition technique such as, e.g., printing. The first isolation layer 140 may provide a further isolation between the top metallization layer in the semiconductor chip 110 and the redistribution line 150.

A redistribution line 150 of a redistribution layer may be arranged on the first isolation layer 140. The redistribution line 150 electrically connects the chip pad 120 with the interconnect 180. The redistribution line 150 may overlie and at least partially cover the chip pad 120. The redistribution line 150 may be one layer or a plurality of layers comprising, e.g., copper, titanium, nickel, gold, tungsten or combinations of these materials. The redistribution line 150 may electrically relocate the chip pad 120 to a different location on the semiconductor device 100.

The redistribution line 150 may be formed applying an electroplating process. In one embodiment a seed layer may be conformally deposited over the first isolation layer 140. The seed layer may be a single material such as copper or a combination of materials. The seed layer may be formed by sputtering or another suitable technique. A mask material such as a plating resist may be deposited over the seed layer. The mask material may be patterned and portions may be removed to form openings exposing parts of the seed layer. A conductive material may be deposited in the openings over seed layer using an electroplating process. The conductive material may be copper or any other suitable material. The remaining mask material may be removed exposing the seed layer and then the exposed seed layer may be removed.

A second isolation layer 160 may be arranged over the redistribution line 150 and the first isolation layer 140. The second isolation layer 160 may be a dielectric material. The dielectric material may comprise a polymer such as a polyimide. The second isolation layer 160 may be deposited using a spin-on deposition or any other suitable deposition technique such as, e.g., printing. The second isolation layer 160 may comprise a same material as or a different material than the first isolation layer 140. The second isolation layer 160 may be a solder stop layer.

An opening is arranged in the second isolation layer 160. The opening may expose a portion of the redistribution line 150 and the underlying first isolation layer 140. The area of the opening exposing the portion of the redistribution line 150 and the underlying first isolation layer 140 may define a pad area 170.

Interconnect 180 is mounted on the pad area 170 in the opening of the second isolation layer 160. The interconnect 180 may be soldered directly on the redistribution line 150. The redistribution line 150 and the soldered interconnect 180 may provide a low-resistance electrical contact and a high-strength anchorage. The interconnect 180 may be a solder ball. The solder ball may be an eutectic Sn—Pb (63 percent tin, 37 percent lead) or a SAC alloys (tin/silver/copper, named for the elemental symbols Sn/Ag/Cu), or any other suitable material.

The semiconductor device 100 illustrates only a single chip pad 120, a single redistribution line 150, and a single interconnect 180 for simplicity. The semiconductor device 100 may include any suitable number of chip pads 120, redistribution lines 150, and interconnects 180.

Embodiments include that one interconnect 180 is soldered to one redistribution line 150 and/or several interconnects 180 are soldered to one redistribution line 150.

Figure 2A:
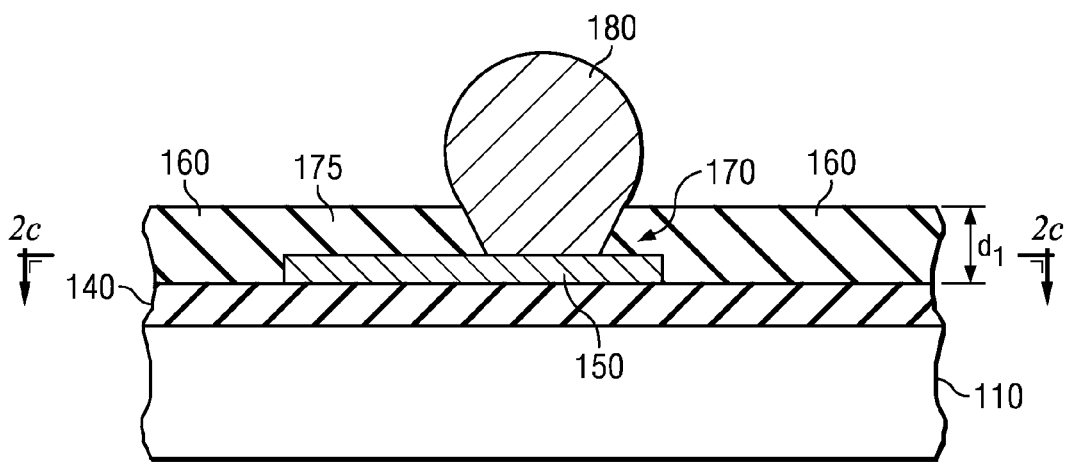
FIG. 2*a* shows a cross sectional view of the pad area in a first direction.

FIG. 2a shows a cross sectional view of a detail of the semiconductor device 100. FIG. 2a illustrates a top portion of the semiconductor device 100 including a top portion of the semiconductor chip 110, the first isolation layer 140, the redistribution line 150, the second isolation layer 160 and the interconnect 180. FIG. 2a further illustrates a pad area 170 and a region 175 outside the pad area. The pad area 170 may be defined as an opening in the second isolation layer 160 exposing portions of the redistribution line 150 and the first isolation layer 140. Region 175 may be defined as the area surrounding the pad area 170. The interconnect 180 is located in an opening of the second isolation layer 160 and soldered directly on the redistribution line 150.

Figure 2B:
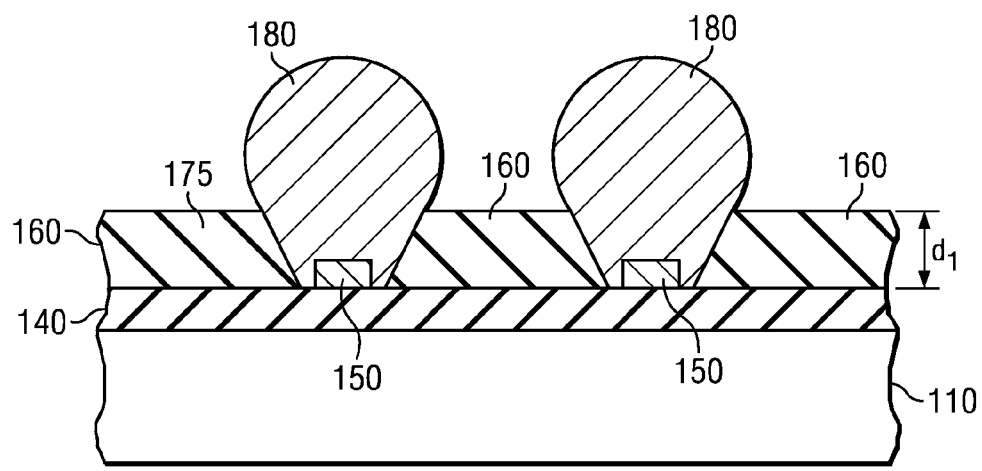
FIG. 2*b* shows a cross sectional view of the two neighboring interconnects.

The second isolation layer 160 may be a relatively thick layer. In conventional technologies, the thickness $d_1$ of the second isolation layer 160 may be 10 μm or less. In one embodiment the thickness $d_1$ of the second isolation layer 160 is about 15 μm or more. The increased thickness of the isolation layer 160 may provide the advantage of preventing two or more interconnects 180 to move too close together during a reflow process. Potential shorts between the two or more interconnects 180 may be avoided. This is shown in FIG. 2b.

A bottom of the interconnect 180 may be located in the opening of the second isolation layer 160. The second isolation layer 160 may directly contact and support the interconnect 180. In one example, the second isolation layer 160 may laterally surround about 6% of the interconnect 180 after soldering for a standard interconnect diameter of nominal 300 μm and for a standard pitch of 0.4 mm. In another example, the second isolation layer 160 may laterally surround about 4% to about 8% of the interconnect 180.

Figure 2C:
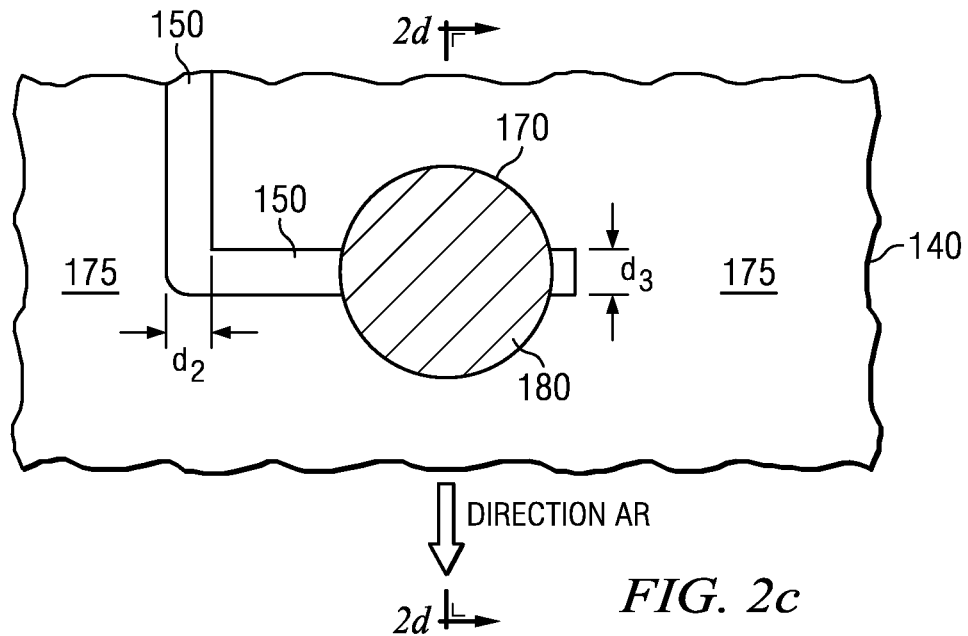
FIG. 2*c* shows a top view of the pad area.

FIG. 2c shows a top view of an embodiment of the semiconductor device 100 along the line 2c-2c of FIG. 2a. FIG. 2c illustrates the first isolation layer 140, the redistribution line 150 and the interconnect 180. The interconnect 180 is placed on and in electrical contact with the redistribution line 150 and the underlying first isolation layer 140 at the pad area 170. The interconnect 180 is placed at or close to an end of the redistribution line 150 in this example but can be placed anywhere along the redistribution line 150 in other examples.

In one embodiment the pad area 170 is a line-pad. The redistribution line 150 may be a line in the pad area 170 so that the pad area 170 comprises a portion of the redistribution line 150 and a portion of the underlying first isolation layer 140. The redistribution line 150 may not form a plane completely covering the pad area 170. In particular, the redistribution line 150 may not form a round pad or rectangular pad covering the complete pad area 170.

In one embodiment the width $d_2$ of the redistribution line 150 in the region 175 (outside the pad area) may be substantially the same as the width $d_3$ of the redistribution line 150 in the pad area 170. In one embodiment the width $d_3$ of the redistribution line 150 in the pad area 170 may not be extended, enlarged or wider relative to the width $d_2$ of the redistribution line in region 175.

In one embodiment the redistribution line 150 is oriented orthogonal to a direction AR to a neutral point of the semiconductor device 100 in the pad area 170 (to be explained further below). The redistribution line 150 in region 175 may have the same orientation or may have a different orientation than the redistribution line 150 in the pad area 170. For example, the redistribution line 150 in region 175 may be arranged parallel to the direction AR.

Figure 2D:
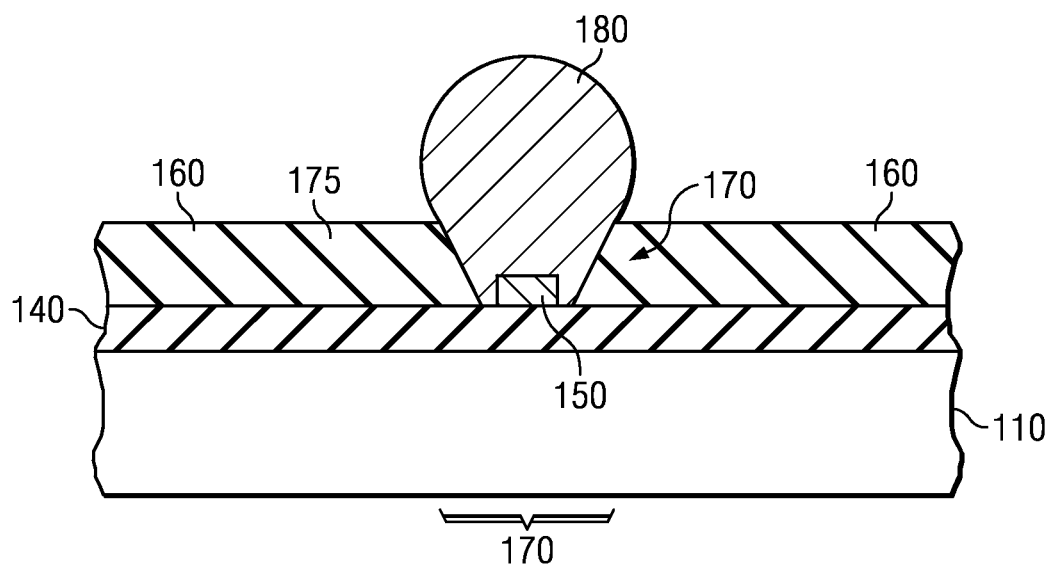
FIG. 2*d* shows a cross sectional view of the pad area in a second direction.

FIG. 2d shows a cross sectional view of an embodiment of the semiconductor device 100 along the line 2d-2d in FIG. 2c. The cross sectional view of FIG. 2d is orthogonal to the cross sectional view of FIG. 2a. FIG. 2d shows the interconnect 180 placed on a pad area 170 in an opening of the second isolation layer 160 directly attached to the redistribution line 150. The pad area 170 comprises the portions of the redistribution line 150 and portions of the underlying first isolation layer 140. The redistribution line 150 in the pad area 170 does not cover the complete pad area 170.

Figure 3A:
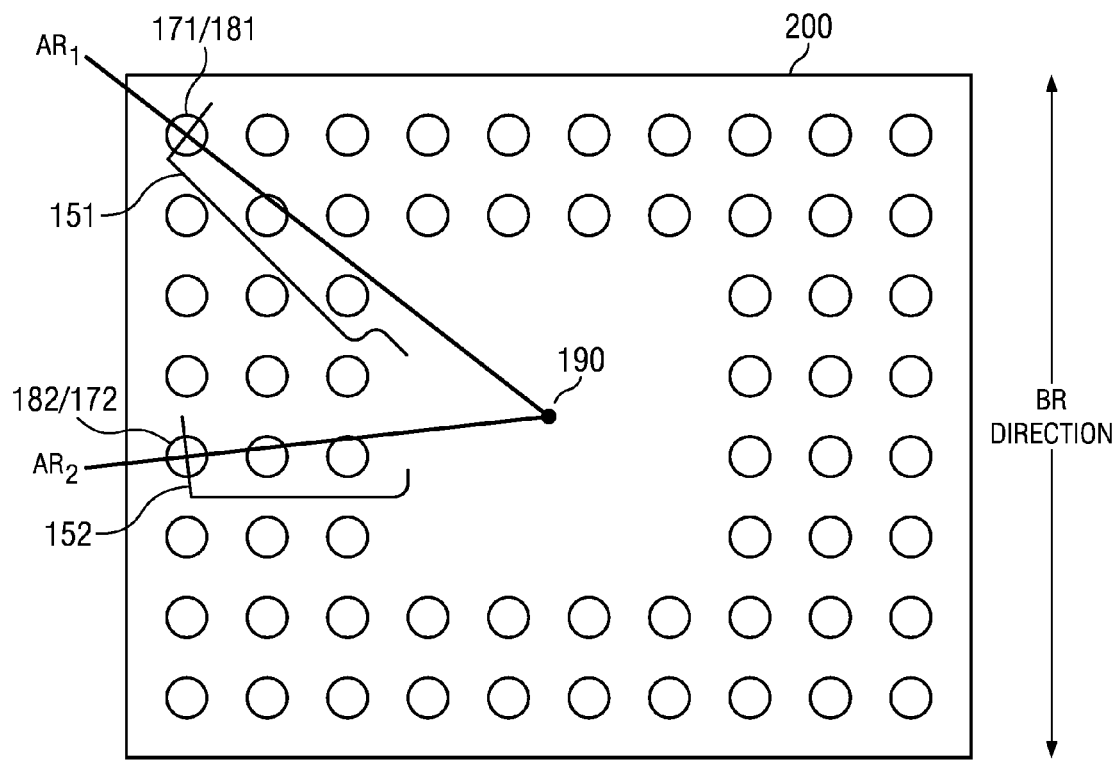
FIG. 3*a* shows a semiconductor device comprising pad areas/interconnects and redistribution lines wherein the redistribution lines in each pad area are routed orthogonal to their respective direction to the neutral point.

FIG. 3a shows an embodiment of a semiconductor device 200. A plurality of interconnects 181/182 are located in pad areas 171/172 on the top surface of the semiconductor device 200. A plurality of redistribution lines 151/152 are illustrated for a better understanding even though they are invisible from the top view. A neutral point 190 may be defined on a top surface of a semiconductor device 200. The neutral point 190 may be a middle or a central point on the top surface of the semiconductor device 200. An Arrow AR indicates a direction from a central point of a pad area 171/172 to the neutral point 190. For example, arrow $AR_1$ indicates a direction from a first pad area 171 to the neutral point 190 and arrow $AR_2$ indicates a direction from a second pad area 172 to the neutral point 190.

A first redistribution line 151 in the pad area/interconnect 171/181 is arranged orthogonal relative to the direction $AR_1$ and a second redistribution line 152 in the pad area/interconnect 172/182 is arranged orthogonal to the direction $AR_2$. As discussed with respect to FIG. 2c, the redistribution lines 151/152 may be routed orthogonal to the direction to the neutral point in the pad area 170/171 but may be routed differently outside the pad area 171/172. In one embodiment the redistribution lines for all pad areas/interconnects may be arranged orthogonal to their respective direction to the neutral point.

Figure 3B:
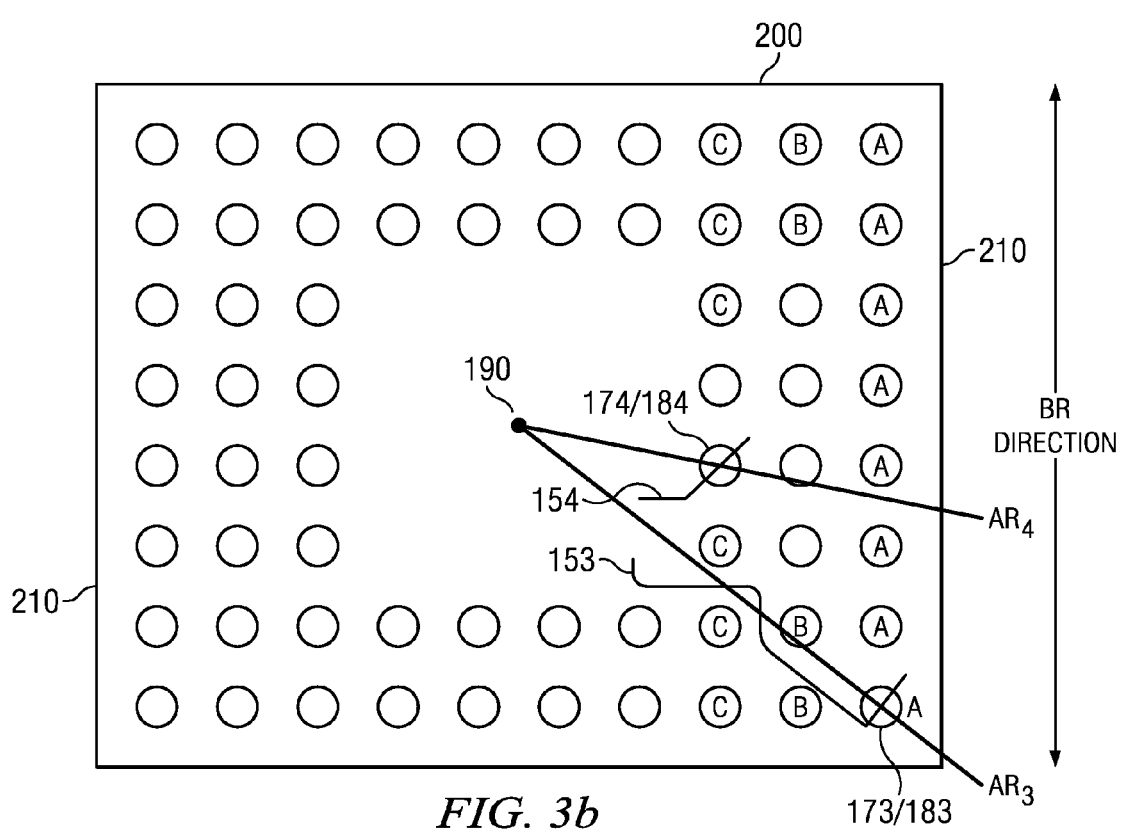
FIG. 3*b* shows a semiconductor device comprising pad areas/interconnects and redistribution lines wherein the redistribution lines in pad areas further away from the neutral point are routed orthogonal to their respective direction to the neutral point, and wherein the redistribution lines in pad areas closer to the neutral point are not routed orthogonal to their respective direction to the neutral point.

FIG. 3b shows another embodiment the semiconductor device 200. A first pad area/interconnect 173/183 is placed at a first distance from the neutral point 190 and a second pad area/interconnect 174/184 is placed at a second distance from the neutral point 190. The second distance is shorter to the neutral point 190 than the first distance. In one embodiment the first redistribution line 153 in the first pad area/interconnect 173/183 is arranged orthogonal to a direction $AR_3$ while the second redistribution line 154 in the pad area/interconnect 174/184 is not arranged orthogonal to a direction $AR_4$. In one embodiment the redistribution lines in the pad areas of the interconnects marked A and B are arranged orthogonal to their respective directions ARs while the redistribution lines in the pad areas of the interconnects marked C are not arranged orthogonal to their respective directions ARs. In one embodiment the first pad area/interconnect 173/183 is located closer to the edge 210 than the second pad area/interconnect 174/184.

In one embodiment the redistribution line 153 in the first pad area/interconnect 173/183 is routed orthogonal to a direction $AR_3$ to the neutral point 190 and is not routed parallel to an edge 210 of the semiconductor device 200.

One redistribution line may comprise two or more pad areas. The redistribution line in each pad area may be routed orthogonal to the respective direction to the neutral point. The redistribution line may be routed orthogonal to directions to the neutral point in some pad areas while the redistribution line is not routed orthogonal to directions to the neutral point in other pad areas. For example, a first portion of the redistribution line in a first pad area with a longer distance to the neutral point is arranged orthogonal to a first direction to the neutral point and a second portion of the redistribution line in a second pad area with a shorter distance to the neutral point may not be arranged orthogonal to a second direction to the neutral point.

A redistribution line interconnect connection for redistribution lines arranged orthogonal to the directions AR in pad areas may be more reliable than for redistribution lines arranged parallel to a direction BR (or parallel to the edges of the semiconductor device) in the pad areas. A redistribution line interconnect connection for redistribution lines arranged orthogonal to the directions AR in pad areas may be more reliable than for redistribution lines arranged parallel to the directions AR in the pad areas.

Figure 4:
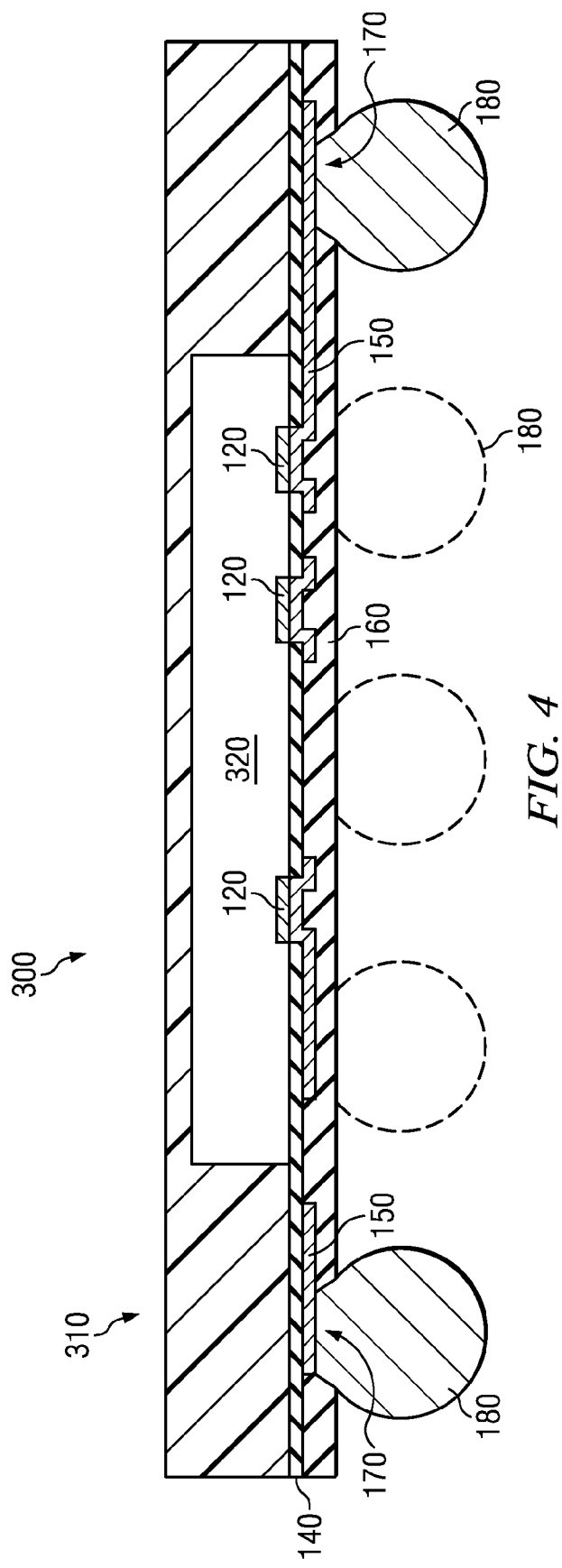
FIG. 4 shows an embedded wafer level ball grid array.

FIG. 4 shows a cross sectional view of a package 300. The package 300 may be an embedded wafer level ball grid array (eWLB). A chip 320 is embedded in a molding compound forming a fan-out region 310 around the chip 320. Chip pads 120 may be located on a surface of the chip 320. The redistribution layer may extend beyond the chip 320 forming pad areas 170 on the chip 320 and the fan-out region 310. The chip pads 120 are rerouted via the redistribution lines 150 of the redistribution layer to the different pad areas 170 on the chip 320 and the fan-out region 310. Such an arrangement allows the design of larger interconnect pitches and/or an increasing number of interconnects.

As described above, the interconnects 180 may be directly attached and soldered to the redistribution lines 150 in the pad areas 170. The redistribution layer may be embedded in the first and second isolation layers 140, 160. The thickness of the second isolation layer may be at least about 15 µm to prevent the interconnects 180 from moving too closely together during a reflow process. The redistribution lines 150 in the pad areas 170 may be arranged orthogonal relative to their directions ARs to a neutral point 190, which may be located at a middle or center of the top surface of the package 300. The widths of the redistribution lines 150 in the pad areas 170 may be less or the same than the widths of the redistribution lines 150 outside of these pad areas 170.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a redistribution layer disposed on a chip, the redistribution layer comprising a first redistribution line;
an isolation layer disposed on the redistribution layer, the isolation layer having a first opening forming a first pad area; and
a first interconnect located in the first opening and in contact with the first redistribution line,
wherein the first redistribution line in the first pad area is routed orthogonal to a first direction to a central point and not routed parallel to an edge of the semiconductor device, and wherein the central point is a central point in a plane parallel to a main surface of the semiconductor device.

2. The semiconductor device according to claim 1, wherein the redistribution layer comprises a second redistribution line, wherein the isolation layer has a second opening forming a second pad area for the second redistribution line, wherein a second interconnect is located in the second opening and in contact with the second redistribution line, and wherein the second redistribution line in the second pad area is routed orthogonal to a second direction to the central point and not routed parallel to the edge of the semiconductor device.

3. The semiconductor device according to claim 1, wherein the redistribution layer comprises a second redistribution line, wherein the isolation layer has a second opening forming a second pad area for the second redistribution line, wherein a second interconnect is located in the second opening and in contact with the second redistribution line, and wherein the second redistribution line in the second pad area is not routed orthogonal to a second direction to the central point.

4. The semiconductor device according to claim 3, wherein the second pad area is closer to the central point than the first pad area.

5. The semiconductor device according to claim 1, wherein the isolation layer is thicker than about 15 μm.

6. The semiconductor device according to claim 1, wherein the semiconductor device comprises an embedded wafer level ball grid array (eWLB).

7. The semiconductor device according to claim 1, wherein the first interconnect is laterally adjacent to and disposed with a distance from the chip.

8. A semiconductor device comprising:
a redistribution layer disposed on a chip, the redistribution layer comprising a plurality of first redistribution lines;
a first isolation layer disposed on the redistribution layer, the first isolation layer having a plurality of first openings forming a plurality of first pad areas, wherein one of the first redistribution lines is disposed in one of the first pad areas; and
a plurality of first interconnects located in the first openings and in contact with the first redistribution lines,
wherein each first redistribution line in each first pad area is routed orthogonal to each first direction to a central point and not routed parallel to an edge of the semiconductor device, and wherein the central point is a central point in a plane parallel to a main surface of the semiconductor device.

9. The semiconductor device according to claim 8, wherein the redistribution layer comprises a plurality of second redistribution lines, wherein the first isolation layer comprises a plurality of second openings forming a plurality of second pad areas, wherein a plurality of second interconnects are located in the second openings and in contact with the second redistribution lines, and wherein each second redistribution line in each second pad area is not routed orthogonal to each second direction to the central point and not routed parallel to the edge of the semiconductor device.

10. The semiconductor device according to claim 9, wherein the first pad areas are closer to the edge of the semiconductor device than the second pad areas.

11. The semiconductor device according to claim 9, further comprising a second isolation layer disposed between the chip and the redistribution layer, wherein the first interconnects and the second interconnects are in contact with portions of the second isolation layer.

12. The semiconductor device according to claim 9, wherein the first interconnects and the second interconnects are laterally adjacent to and disposed with distances from the chip.

13. The semiconductor device according to claim 8, wherein the first isolation layer is thicker than about 15 μm.

14. A semiconductor device comprising:
a redistribution layer disposed on a chip, the redistribution layer comprising a first redistribution line;
a first isolation layer disposed on the redistribution layer, the first isolation layer having a first opening forming a first pad area, wherein a first width of the first redistribution line is not larger in the first pad area than outside of the first pad area in plan view; and
a bump located in the first opening and in contact with the first redistribution line.

15. The semiconductor device according to claim 14, further comprising a central point in a plane parallel to a main surface of the semiconductor device, wherein the first redistribution line in the first pad area is routed orthogonal to a first radial direction to the central point and not routed parallel to an edge of the semiconductor device.

16. The semiconductor device according to claim 15, wherein the redistribution layer comprises a second redistribution line, a second opening in the first isolation layer, the second opening forming a second pad area, wherein the second redistribution line in the second pad area is not oriented orthogonal to a second radial direction to the central point.

17. The semiconductor device according to claim 16, wherein the second pad area is disposed closer to the central point than the first pad area.

18. The semiconductor device according to claim 16, wherein the first pad area is located closer to the edge of the semiconductor device than the second pad area.

19. The semiconductor device according to claim 14, wherein the first isolation layer is thicker than about 15 μm.

20. The semiconductor device according to claim 14, further comprising a second isolation layer disposed between the chip and the redistribution layer, wherein the bump is in contact with the second isolation layer.

21. The semiconductor device according to claim 14, wherein the first width of the first redistribution line is the same in the first pad area and outside of the first pad area in plan view.

* * * * *